US012696542B2

(12) United States Patent
Wu

(10) Patent No.: US 12,696,542 B2
(45) Date of Patent: Jul. 28, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Yongbo Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 595 days.

(21) Appl. No.: 17/787,698

(22) PCT Filed: May 20, 2022

(86) PCT No.: PCT/CN2022/094176
§ 371 (c)(1),
(2) Date: Jun. 21, 2022

(87) PCT Pub. No.: WO2023/216307
PCT Pub. Date: Nov. 16, 2023

(65) Prior Publication Data
US 2023/0361129 A1 Nov. 9, 2023

(30) Foreign Application Priority Data
May 7, 2022 (CN) .......................... 202210494533.4

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01); *H10D 86/481* (2025.01)

(58) Field of Classification Search
CPC .............. G02F 1/136204; H10D 86/60; H10D 86/441; H10D 86/481; H10D 86/451;
(Continued)

(56) References Cited

U.S. PATENT DOCUMENTS 9,001,280 B2 4/2015 Xu et al.
2017/0031218 A1* 2/2017 Li ........................ H10D 86/421
(Continued)

FOREIGN PATENT DOCUMENTS

CN 105911787 A 8/2016
CN 107664891 A 2/2018
(Continued)

OTHER PUBLICATIONS

PCT International Search Report for International Application No. PCT/CN2022/094176, mailed on Dec. 16, 2022, 10pp.
(Continued)

*Primary Examiner* — Fernando L Toledo
*Assistant Examiner* — Marshall Mu-Nuo Hatfield
(74) *Attorney, Agent, or Firm* — The Roy Gross Law Firm, LLC; Roy D. Gross

(57) ABSTRACT

A display panel is provided, including a substrate, a thin film transistor layer, a shielding layer, and a peripheral wiring. The thin film transistor layer is disposed on the substrate and in a display area. The shielding layer is disposed between the substrate and the thin film transistor layer, and disposed in the display area. The peripheral wiring is disposed in a non-display area and electrically connected to the shielding layer. The peripheral wiring includes lead portions and resistance portions, and a resistance of one of the resistance portions is greater than a resistance of one of the lead portions corresponding to a shortest distance between the shielding layer and the one of the lead portions.

19 Claims, 5 Drawing Sheets

(58) Field of Classification Search
CPC .... H10D 30/6723; H10D 89/911; H10D 1/47; H10K 59/1213; H10K 59/126; H10K 59/131; H01L 23/60
See application file for complete search history.

(56) References Cited

U.S. PATENT DOCUMENTS

| | | | |
|---|---|---|---|
| 2017/0317114 A1* | 11/2017 | Noh et al. | |
| 2019/0019966 A1* | 1/2019 | Jiang | H10K 59/131 |
| 2019/0273096 A1 | 9/2019 | Wang et al. | |
| 2020/0013970 A1* | 1/2020 | Wang | H10K 77/111 |
| 2020/0219907 A1 | 7/2020 | Lee et al. | |
| 2021/0335984 A1* | 10/2021 | Liu | G02F 1/136286 |
| 2021/0405489 A1* | 12/2021 | Cheng | G02F 1/1345 |
| 2022/0181418 A1* | 6/2022 | Huang | H10D 86/423 |
| 2022/0344224 A1 | 10/2022 | Li et al. | |

FOREIGN PATENT DOCUMENTS

| | | |
|---|---|---|
| CN | 110275333 A | 9/2019 |
| CN | 209592036 U | 11/2019 |
| CN | 113517262 A | 10/2021 |
| CN | 114242736 A | 3/2022 |
| CN | 114284248 A | 4/2022 |
| JP | 2002083968 A | 3/2002 |
| JP | 2010107945 A | 5/2010 |
| JP | 2014081641 A | 5/2014 |
| WO | 2021168730 A1 | 9/2021 |

OTHER PUBLICATIONS

PCT Written Opinion of the International Search Authority for International Application No. PCT/CN2022/094176, mailed on Dec. 16, 2022, 9pp.

Japanese Office Action issued in corresponding Japanese Patent Application No. 2023-519081 dated Jun. 25, 2024, pp. 1-5, 10pp.

Korean Office Action issued in corresponding Korean Patent Application No. 10-2022-7029205 dated Oct. 27, 2023, pp. 1-7, 15pp.

Chinese Office Action issued in corresponding Chinese Patent Application No. 202210494533.4 dated May 26, 2025, pp. 1-9, 18pp.

European Office Action issued in corresponding European Patent Application No. 22757814.3 dated Feb. 27, 2026, pp. 1-44.

* cited by examiner

DISPLAY PANEL

This application is a National Phase of PCT Patent Application No. PCT/CN2022/094176 having International filing date of May 20, 2022, which claims the benefit of priority of Chinese Application No. 202210494533.4, filed May 7, 2022, the contents of which are all incorporated herein by reference in their entirety.

FIELD OF DISCLOSURE

The present disclosure relates to the field of display technologies, in particular to the field of display panel manufacturing technologies, and in particular to a display panel.

BACKGROUND

In bottom shield metal (BSM) technologies, a metal part is arranged between a substrate and a transistor to reduce a back-channel phenomenon caused by charges in the substrate to the transistor.

In the BSM technologies, a plurality of introduced metal parts are generally connected to a peripheral wiring to be loaded with voltage. However, static electricity generated during a production or an operation of a display panel is conducted to the peripheral wiring through the plurality of metal parts. After an accumulation of static electricity in the peripheral wiring, it will be discharged to damage the display panel and reduce a yield or quality of the display panel.

Therefore, the existing display panels made by using the BSM technology have a risk of being damaged due to static electricity accumulation, which needs to be improved.

SUMMARY OF DISCLOSURE

Embodiments of the present disclosure provide a display panel to solve a problem that an existing display panel made with BSM technologies is damaged due to an accumulation of static electricity.

An embodiment of the present disclosure provides a display panel including a display area and a non-display area surrounding the display area, and the display panel includes:
  a substrate;
  a thin film transistor layer disposed on the substrate and in the display area;
  a shielding layer disposed between the substrate and the thin film transistor layer, and disposed in the display area; and
  a peripheral wiring disposed in the non-display area and electrically connected to the shielding layer.

The peripheral wiring includes lead portions and resistance portions, each of the resistance portions includes a first end and a second end, the first end is connected to the shielding layer, the second end is connected to one of the lead portions, and a resistance of one of the resistance portions is greater than a resistance of one of the lead portions corresponding to a shortest distance between the first end and the second end.

The resistance portions are disposed on both sides or a same side of an imaginary connection line of the shortest distance between the first end and the second end.

A resistivity of one of the resistance portions is greater than a resistivity of one of the lead portions.

In one embodiment, at least one side of one of the resistance portions at the imaginary connection line of the shortest distance between the first end and the second end is curved.

In one embodiment, the resistance portions and the lead portions are arranged on a same layer.

In one embodiment, the thin film transistor layer includes a plurality of thin film transistors disposed in the display area, the shielding layer includes shielding blocks and shielding wires, the shielding blocks are in one-to-one correspondence with the plurality of transistors and overlap with the plurality of transistors, and each of the shielding wires is connected to two adjacent shielding blocks.

The resistance portions of the peripheral wiring are electrically connected to the shielding wires and arranged in a same layer.

In one embodiment, the shielding layer includes a plurality of shielding groups extending along a first direction and arranged along a second direction, one end of one of the shielding groups is electrically connected to one of the resistance portions, another end of the one of the shielding groups is electrically connected to another one of the resistance portions.

In one embodiment, the thin film transistor layer includes:
  an active layer disposed on a side of the shielding layer away from the substrate;
  a first insulating layer disposed on a side of the active layer away from the substrate;
  a gate layer disposed on a side of the first insulating layer away from the substrate;
  a second insulating layer disposed on a side of the gate layer away from the substrate; and
  a source-drain layer disposed on a side of the second insulating layer away from the substrate.
  Each of the resistance portions includes a first resistance portion or a second resistance portion, the first resistance portion is disposed on a same layer as the active layer, and the second resistance portion is disposed on a same layer as the source-drain layer.

An embodiment of the present disclosure provides a display panel, including a display area and a non-display area surrounding the display area, and the display panel includes:
  a substrate;
  a thin film transistor layer disposed on the substrate and in the display area;
  a shielding layer disposed between the substrate and the thin film transistor layer, and disposed in the display area; and
  a peripheral wiring disposed in the non-display area and electrically connected to the shielding layer.

The peripheral wiring includes lead portions and resistance portions, each of the resistance portions includes a first end and a second end, the first end is connected to the shielding layer, the second end is connected to one of the lead portions, and a resistance of one of the resistance portions is greater than a resistance of one of the lead portions corresponding to a shortest distance between the first end and the second end.

In one embodiment, the resistance portions are disposed on both sides or a same side of an imaginary connection line of the shortest distance between the first end and the second end.

In one embodiment, at least one side of one of the resistance portions at the imaginary connection line of the shortest distance between the first end and the second end is curved.

In one embodiment, the resistance portions and the lead portions are arranged on a same layer.

In one embodiment, the thin film transistor layer includes a plurality of thin film transistors disposed in the display area, the shielding layer includes shielding blocks and shielding wires, the shielding blocks are in one-to-one correspondence with the plurality of transistors and overlap with the plurality of transistors, and each of the shielding wires is connected to two adjacent shielding blocks.

The resistance portions of the peripheral wiring are electrically connected to the shielding wires and arranged in a same layer.

In one embodiment, the shielding layer includes a plurality of shielding groups extending along a first direction and arranged along a second direction, one end of one of the shielding groups is electrically connected to one of the resistance portions, another end of the one of the shielding groups is electrically connected to another one of the resistance portions.

In one embodiment, a resistivity of one of the resistance portions is greater than a resistivity of one of the lead portions.

In one embodiment, the thin film transistor layer includes:
an active layer disposed on a side of the shielding layer away from the substrate;
a first insulating layer disposed on a side of the active layer away from the substrate;
a gate layer disposed on a side of the first insulating layer away from the substrate;
a second insulating layer disposed on a side of the gate layer away from the substrate; and
a source-drain layer disposed on a side of the second insulating layer away from the substrate.

Each of the resistance portions includes a first resistance portion or a second resistance portion, the first resistance portion is disposed on a same layer as the active layer, and the second resistance portion is disposed on a same layer as the source-drain layer.

In one embodiment, a resistivity of the first resistance portion is the same as a resistivity of the active layer, and a resistivity of the second resistance portion is the same as a resistivity of the source-drain layer.

In one embodiment, the source-drain layer includes:
a first metal layer, where a constituent material of the first metal layer includes titanium, and the first resistance portion and the first metal layer are arranged in the same layer; and
a second metal layer disposed on a side of the first metal layer away from the substrate, where constituent material of the second metal layer is different from the constituent material of the first metal layer.

In one embodiment, the display panel further includes:
a via hole connected between one of the resistance portions and one of the lead portions; and
a conductor portion filled in the via hole, where the conductor portion electrically connects the one of the resistance portions and the one of the lead portions.

In one embodiment, a constituent material of the shielding layer is the same as a constituent material of the peripheral wiring, and the shielding layer and the peripheral wiring are arranged in a same layer.

In one embodiment, the resistance portions and the lead portions are arranged in different layers, a projection of one of the resistance portions on a plane perpendicular to the substrate extends beyond a layer where the shielding layer is located, and one of the resistance portions includes two curved portions disposed on both sides or a same side of one of the lead portions corresponding to the shortest distance between the first end and the second end.

In one embodiment, a length of one of the lead portions is greater than the shortest distance between the first end and the second end.

The display panel provided by the embodiments of the present disclosure includes the display area and the non-display area surrounding the display area. The display panel includes the substrate, the thin film transistor layer, the shielding layer, and the peripheral wiring. The thin film transistor layer is disposed on the substrate and in the display area. The shielding layer is disposed between the substrate and the thin film transistor layer, and disposed in the display area. The peripheral wiring is disposed in the non-display area and electrically connected to the shielding layer. The peripheral wiring includes the lead portions and the resistance portions, each of the resistance portions includes the first end and the second end, the first end is connected to the shielding layer, the second end is connected to one of the lead portions, and the resistance of one of the resistance portions is greater than the resistance of one of the lead portions corresponding to the shortest distance between the first end and the second end. The present disclosure increases a resistance value per unit length of an extension path of the peripheral wiring by setting the resistance value of the resistance portion to be larger in a unit size. Thus, a total resistance value of the peripheral wiring is increased, so as to improve an antistatic capability of the peripheral wiring, and a yield or quality of the display panel is improved.

BRIEF DESCRIPTION OF DRAWINGS

Technical solutions and other beneficial effects of the present disclosure will be apparent through the detailed description of the specific embodiments of the present disclosure with reference to accompanying drawings.

DETAILED DESCRIPTION

Figure 1:
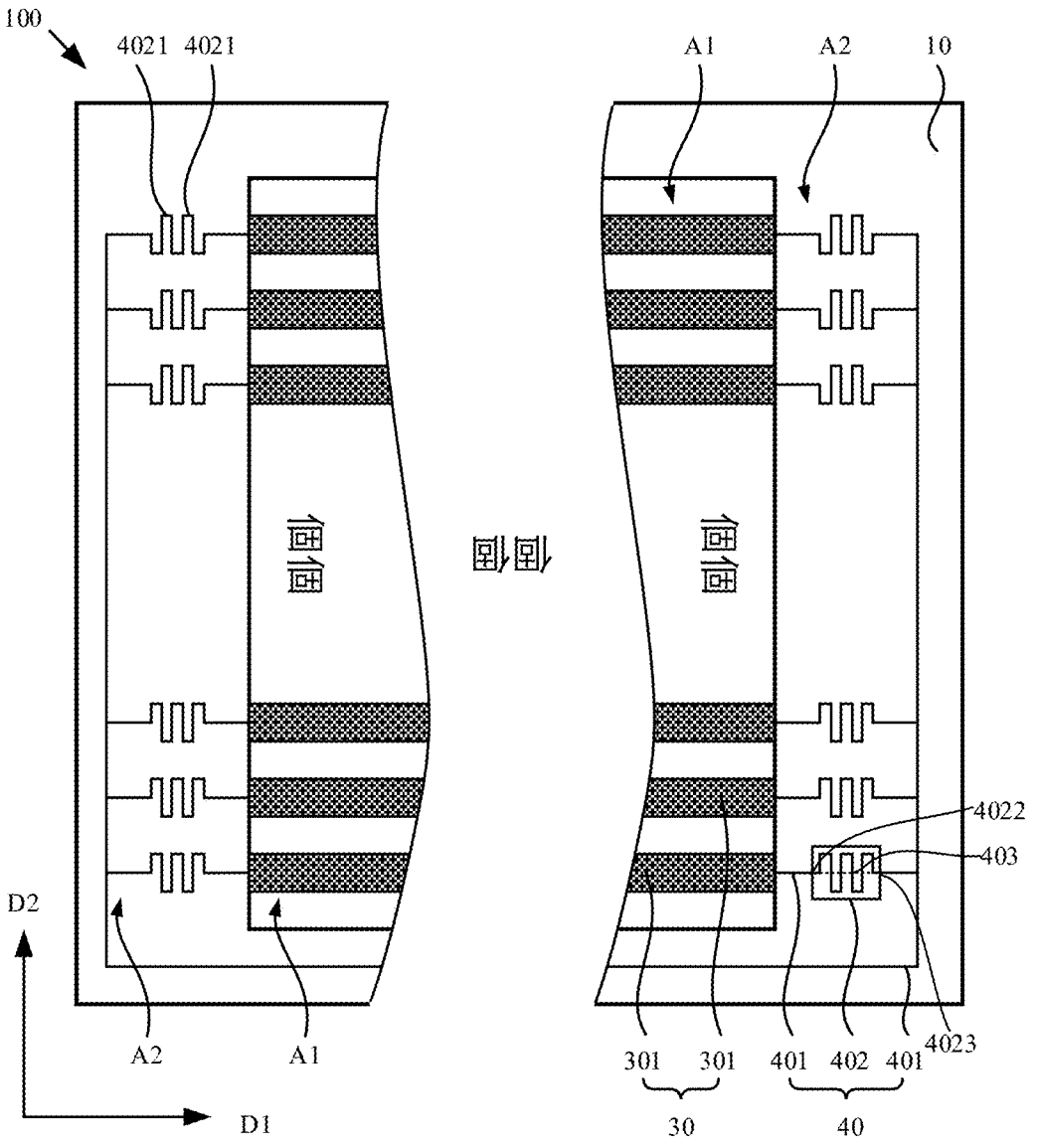
FIG. 1 is a schematic top view of a partial structure of a display panel of an embodiment of the present disclosure.

The technical solutions in the embodiments of the present disclosure will be clearly and continuously described below with reference to the accompanying drawings in the embodiments of the present disclosure. Obviously, the described embodiments are only some, but not all, embodiments of the present disclosure. Based on the embodiments in the present disclosure, all other embodiments obtained by those skilled in the art without creative efforts shall fall within a protection scope of the present disclosure.

In the description of the present disclosure, it should be understood that, a direction or location relationship indicated by a term, such as "proximal", "extended", "side", "end", is a direction or a location relationship shown based on the accompanying drawings, to conveniently describe the embodiments of the present application and to simplify the description, but does not indicate or imply that a mentioned device or element needs to have a particular direction and is constructed and operated in the particular direction. Therefore, the direction or location relationship shall not be understood as a limitation on the present application. In addition, terms "first" and "second" are only used to describe the objective and shall not be understood as indicating or implying relative importance or implying a quantity of the indicated technical features. Thus, a feature defined to be "first" or "second" may explicitly or implicitly include one or more features. In the descriptions of the embodiments of the present application, "a plurality of" means two or more, unless otherwise definitely and specifically defined.

Reference herein to "embodiment" means that a particular feature, structure, or characteristic described in connection with the embodiment can be included in at least one embodiment of the invention. The appearances of this phrase in various places in the specification are not necessarily all referring to the same embodiment, nor are separate or alternative embodiments mutually exclusive of other embodiments. The embodiments described herein, explicitly and implicitly understood by one skilled in the art, may be combined with other embodiments.

Embodiments of the present disclosure provide a display panel including but not limited to the following embodiments and combinations of the following embodiments.

In one embodiment, as shown in FIG. 1 to FIG. 5, the display panel 100 includes a display area A1 and a non-display area A2 surrounding the display area A1. The display panel 100 includes a substrate 10, a thin film transistor layer 20, a shielding layer 30, and a peripheral wiring 40. The thin film transistor layer 20 is disposed on the substrate 10 and in the display area A1. The shielding layer 30 is disposed between the substrate 10 and the thin film transistor layer 20, and disposed in the display area A1. The peripheral wiring 40 is disposed in the non-display area A2 and electrically connected to the shielding layer 30. The peripheral wiring 40 includes lead portions 401 and resistance portions 402, each of the resistance portions 402 includes a first end 4022 and a second end 4023, the first end 4022 is connected to the shielding layer 30, the second end 4023 is connected to one of the lead portions 401, and a resistance of one of the resistance portions 402 is greater than a resistance of one of the lead portions 401 corresponding to a shortest distance between the first end and the second end. It can be understood that in a connection direction of the lead portion 401 and the resistance portion 402, in a unit size, a resistance value of the resistance portion 402 is greater than a resistance value of the corresponding lead portion 401 connected in series therewith.

The substrate 10 can be a flexible substrate or a rigid substrate. A constituent material of the flexible substrate may include, but is not limited to, polyimide. A constituent material of the rigid substrate may include, but is not limited to, silicon dioxide. Specifically, as shown in FIG. 1 to FIG. 5, a thin film transistor layer 20 and a pixel layer may be provided in the display area A1. The pixel layer is disposed on the thin film transistor layer 20. The thin film transistor layer 20 includes a plurality of transistors 201. The pixel layer may include a plurality of sub-pixels which are in one-to-one correspondence with the plurality of transistors 201. Each sub-pixel is electrically connected to a corresponding transistor 201. Each transistor 201 controls the corresponding sub-pixel to emit light, so that the display area A1 of the display panel 100 can display an image. Apparently, the non-display area A2 may be provided with lines or circuits electrically connected to at least one of the thin film transistor layer 20, the peripheral wiring 40, and the shielding layer 30.

It should be noted that a large amount of polarizable charges existing in the substrate 10 are easily polarized to form a large amount of polarized charges due to external influences or the influence of an internal electric field of the display panel 100. The large amount of polarized charges on a side of the substrate 10 close to the thin film transistor layer 20 will polarize the thin film transistor layer 20, which will affect a charge movement in the transistor 201 and reduce a reliability of an operation of the transistor 201. On this basis, in this embodiment, the shielding layer 30 is provided in the display area A1 between the substrate 10 and the thin film transistor layer 20. The shielding layer 30 can reduce the polarization of the thin film transistor layer 20 to improve the reliability of the thin film transistors. For example, the shielding layer 30 can be a conductor or a semiconductor, and can be loaded with a shielding potential by being electrically connected to the peripheral wiring 40 to reduce the polarization of the thin film transistor layer 20.

Figure 7:
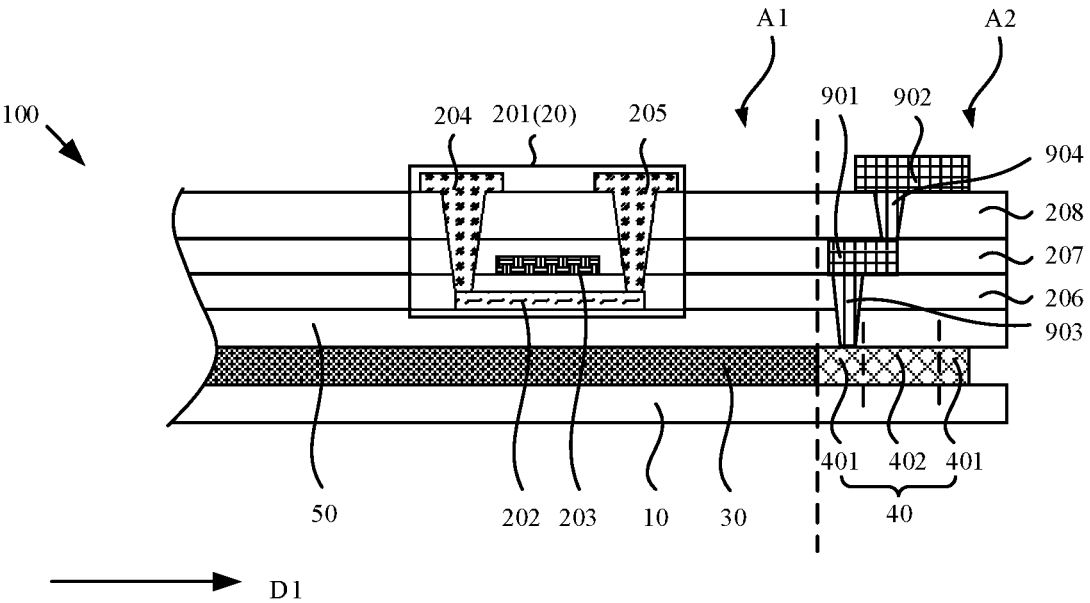
FIG. 7 is a schematic cross-sectional view of a partial structure of a fifth display panel of an embodiment of the present disclosure.

Specifically, the shielding potential loaded on the shielding layer 30 and the peripheral wiring 40 may be equal to a first voltage, and the first voltage may not be equal to a ground voltage. Furthermore, the first voltage may be greater than 0 and not greater than 4.6 volts. Alternatively, as shown in FIG. 7, the shielding layer 30 and the peripheral wiring 40 can also be electrically connected to a source portion or a drain portion of the corresponding transistor 201, and a voltage of the source portion or a voltage of the drain portion to be loaded serves as the corresponding first voltage. Specifically, a second connection layer 902 is electrically connected to the source portion or the drain portion. The peripheral wiring 40 may be electrically connected to the source portion or the drain portion through a first conductor portion 903, a first connection layer 901, a second conductor portion 904, and the second connection layer 902 in order to be loaded with the first voltage. The first conductor portion 903 extends through a buffer layer 50 and a first insulating layer 206. The first connection layer 901 and a gate layer 203 are arranged in a same layer. The second conductor portion 904 extends through an interlayer dielectric layer 208. The second connection layer 902 is arranged on the same layer as the source and the drain. The shielding layer 30 is electrically connected to the source portion or the drain portion through the peripheral wiring 40 to be loaded with the first voltage. It should be noted that, since the first voltage is not equal to the ground voltage, static electricity generated during the fabrication or operation of the display panel 100 will be conducted to the peripheral wiring 40 through the shielding layer 30. In addition, the requirement of high light transmittance of the display area A1 results in a smaller size of the shielding layer 30, so that the shielding layer 30 cannot share more static electricity to reduce the static electricity flowing into the peripheral wiring 40. As a result, static electricity in the peripheral wiring 40 is continuously accumulated and then discharged to damage the display panel 100, thereby reducing the yield or quality of the display panel.

Figure 2:
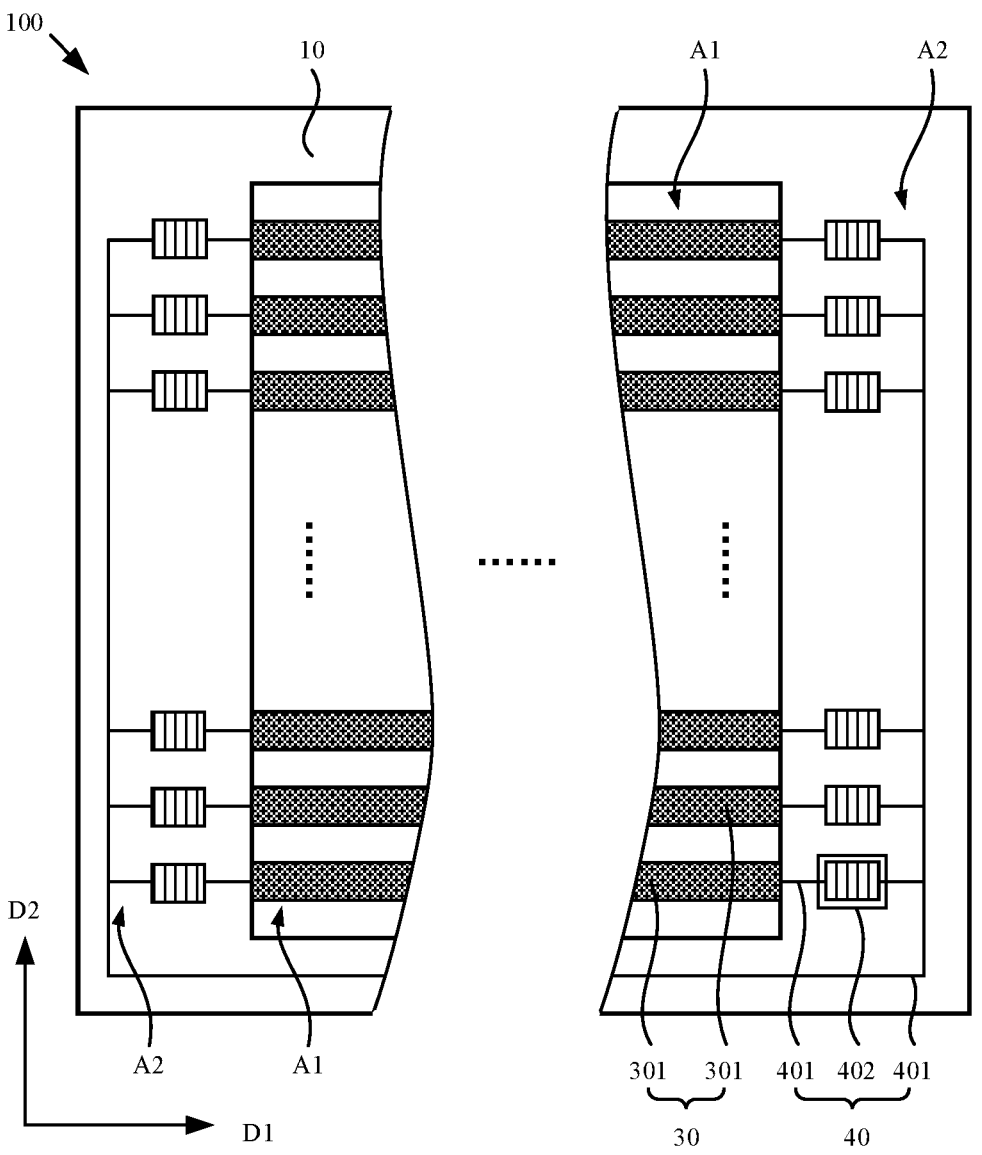
FIG. 2 is a schematic top view of a partial structure of another display panel of an embodiment of the present disclosure.

It can be understood that, as shown in FIG. 1 and FIG. 2, in this embodiment, the peripheral wiring 40 includes the lead portion 401 and the resistance portion 402 connected in series with the lead portion 401. The resistance of the resistance portion 402 is greater than the resistance of the lead portion 401 corresponding to the shortest distance between the first end and the second end. The "the resistance of the lead portion 401 corresponding to the shortest distance between the first end and the second end" can be understood as a corresponding resistance value when a length of the lead portion 401 is the shortest distance between the first end and the second end. That is, in this embodiment, the resistance portion 402 may have a greater resistance than the lead portion 401 corresponding to the shortest distance between the first end and the second end, and thus the peripheral wiring 40 may have a greater resistance. Alternatively, it is understood that in a connection direction, in a unit size, a resistance value of the resistance portion 402 is greater than a resistance value of the corresponding lead portion 401 connected in series therewith. Each connection direction corresponds to one resistance portion 402 and at least one lead portion 401. It can be understood that each resistance portion 402 is connected to at least one lead portion 401 in the corresponding connection direction. Of course, there is also a lead portion 401 that is not connected in series with the resistance portion 402, in which case the "connection direction" mentioned above does not exist. That is, on a premise that an extension path length of the peripheral wiring 40 is substantially unchanged, the present embodiment increases the resistance value of the resistance portion 402 in a unit size in the connection direction, such that the resistance value per unit length of the extension path of the peripheral wiring 40 including the resistance portion 402 is larger than the resistance value per unit length of the extension path of the peripheral wiring 40 not including the resistance portion 402. Therefore, a total resistance value of the peripheral wiring 40 in the non-display area A2 can be increased, which improves the anti-static ability of the peripheral wiring 40, thereby improving the yield or quality of the display panel 100.

In one embodiment, as shown in FIG. 1 and FIG. 2, one end of the shielding group 301 is electrically connected to one of the resistance portions 402, and another other end of the shielding group 301 is electrically connected to another one of the resistance portions. It should be noted that the resistance of a conductor to current flow is called the resistance of the conductor. A free charge in the conductor makes a regular directional movement under an action of an electric field force to form an electric current. That is, it can be understood that the greater the resistance value of the conductor, the greater the resistance to static electricity. Specifically, the plurality of shielding groups 301 are as a whole, and the peripheral wiring 40 in the non-display area A2 is electrically connected to the shielding layer 30. It can be understood that, in this embodiment, the plurality of resistance portions 402 in the peripheral wiring 40 are dispersed and connected to two ends of the shielding layer 30 correspondingly. That is, the plurality of resistance portions 402 are dispersed in two opposite regions in the non-display area A2, so that an arrangement of the resistance portions 402 in the peripheral wiring 40 with "larger resistance to current flow" is more uniform. It is prevented that the resistance portions 402 are concentrated in one area of the non-display area A2, resulting in that the resistance of the peripheral wiring 40 in other areas of the non-display area A2 is relatively small and cannot block more static electricity, thereby causing discharge to damage the display panel 100.

It should be noted that the extension path of the peripheral wiring 40 is not limited in the present disclosure, as long as it satisfies "in the non-display area A2" and "being electrically connected to the shielding layer 30". For example, as shown in FIG. 1 and FIG. 2, the peripheral wiring 40 is provided around a left side, a lower side, and a right side of the shielding layer 30 as an example for description here. Furthermore, a portion of the peripheral wiring 40 on the left side of the shielding layer 30 may be connected to the left side of the shielding layer 30. A portion of the peripheral wiring 40 on the right side of the shielding layer 30 may be connected to the right side of the shielding layer 30. The portion of the peripheral wiring 40 on the left side of the shielding layer 30 and the portion on the right side of the shielding layer 30 may be connected to the lower side of the shielding layer 30. Furthermore, for the portion of the peripheral wiring 40 on the left or right side of the shielding layer 30, it includes a trunk wiring and a plurality of branch wirings corresponding to the plurality of shielding groups 301 one-to-one. One end of each branch wiring is electrically connected to a corresponding shielding group 301, and another end of each branch wiring is electrically connected to the corresponding trunk wiring near an edge of the display panel 100. Each branch wiring includes one resistance portion 402 and one lead portion 401 connected in series with at least at one end of the resistance portion 402. In combination with the above discussion, for the resistance portion 402 and the lead portion 401 located on the same trunk wiring, the connection direction is parallel to the first direction D1.

Figure 3:
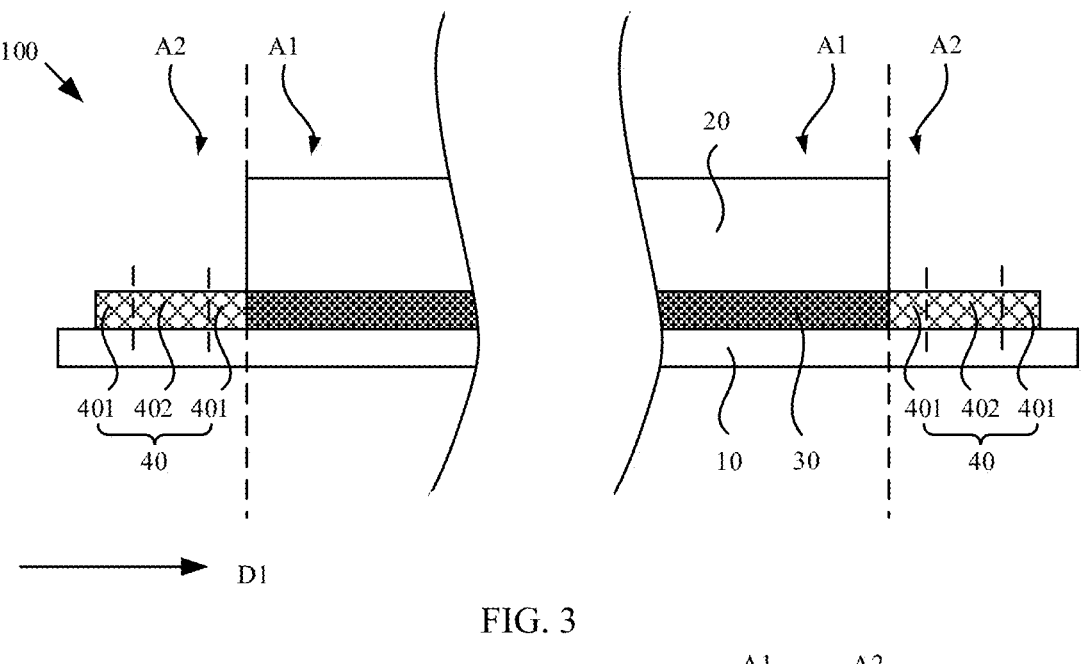
FIG. 3 is a schematic cross-sectional view of a partial structure of a first display panel of an embodiment of the present disclosure.

In one embodiment, as shown in FIG. 1 and FIG. 3, the resistance portions 402 are arranged on both sides or a same side of an imaginary connection line 403 of the shortest distance between the first end 4022 and the second end 4023. For example, when the resistance portions 402 are disposed on the same side of the imaginary connection line 403 of the shortest distance between the first end 4022 and the second end 4023, the resistance portions 402 may be curved or arranged in a straight line not parallel to the first direction D1 to increase resistance. For another example, as shown in FIG. 1, when the resistance portions 402 are disposed on both sides of the imaginary connection line 403 of the shortest distance between the first end and the second end, a connection line between the resistance portions 402 disposed on both sides of the imaginary connection line 1 of the shortest distance between the first end 4022 and the second end 4023 has a projection at least in the second direction D2 to increase resistance. Thus, it is not limited here whether the resistance portions 402 are disposed on the same side of the imaginary connection line 403 of the shortest distance between the first end 4022 and the second end 4023 in a straight line parallel to the first direction D1.

In one embodiment, at least one side of the resistance portion 402 at the imaginary connection line of the shortest distance between the first end and the second end is curved. Specifically, the resistance portions 402 are arranged on both sides of the imaginary connection line of the shortest distance between the first end and the second end as an example for description here. The resistance portion 402 includes a plurality of sub-resistance portions 4021 arranged in a row. The sub-resistance portions 4021 are curved. A bending direction of the sub-resistance portions 4021 and an arrangement direction of the plurality of sub-resistance portions 4021 are not limited here. In conjunction with the above discussion, the bending direction of the sub-resistance portions 4021 may be parallel to the second direction D2, and the plurality of sub-resistance portions 4021 in the curved shape may be arranged along the first direction D1.

It can be understood that under a condition that a size of the non-display area A2 in the first direction D1 is constant, in this embodiment, the extension path of the resistance portion 402 is bent back and forth in the second direction D2, which can make a total length of the resistance portion 402 longer. When a constituent material of the peripheral wiring 40 is the same, the resistance value of the resistance portions 402 is larger. Thus, the above-mentioned "in the connection direction (parallel to the first direction D1), in a unit size, the resistance value of the resistance portion 402 is greater than the resistance value of the corresponding lead portion 401 connected in series therewith" is achieved.

Furthermore, the shape and number of the plurality of sub-resistance portions 4021 disposed in each resistance portion 402 may be the same. That is, the shape and size of the plurality of resistance portions 402 may be the same. That is, the plurality of resistance portions 402 have comparable accommodating and blocking abilities to static electricity. When the plurality of resistance portions 402 in the peripheral wiring 40 are more uniformly arranged, the above arrangement can further uniformize the accommodating and blocking ability of the portion of the peripheral wiring 40 where the resistance portions 402 are provided with respect to static electricity. It is possible to reduce the risk that different resistance portions 402 have large differences in the accommodating and blocking capabilities of static electricity, resulting in a small resistance in the peripheral wiring 40 that cannot block more static electricity and causing discharge to damage the display panel 100.

In one embodiment, as shown in FIG. 1 and FIG. 3, the resistance portions 402 and the lead portions 401 are arranged in the same layer. It can be understood that, in this embodiment, the resistance portions 402 and the lead portions 401 are disposed in the same layer to prevent an additional thickness of the display panel 100 from being increased. Furthermore, a constituent material of the resistance portions 402 is the same as a constituent material of the lead portions 401. The resistance portions 402 and the lead portions 401 can be formed at the same time, or even integrally formed, to save the process. In conjunction with the above discussion, the plurality of sub-resistance portions 4021 connected to each other and in a curved shape and the lead portions 401 connected to the plurality of sub-resistance portions 4021 can be formed by the same process, thereby simultaneously forming the peripheral wiring 40 at one time.

It can be understood that, in combination with the above discussion, "when the constituent material of the peripheral wiring 40 is the same, the resistance value of the resistance portions 402 is larger", that is, in the present embodiment, on the basis that the "resistance portion 402 includes the plurality of sub-resistance portions 4021 that are connected and arranged in a curved shape", the resistance value of the resistance portions 402 can be larger. Specifically, the constituent material of the resistance portions 402 and the constituent material of the lead portions 401 may be, but not limited to, conductor materials and semiconductor materials. The conductive material may include, but are not limited to, metal elements. The semiconductor material may include, but is not limited to, silicon element, oxides, and oxides containing silicon elements. The metal element can be, but not limited to, molybdenum and titanium.

In one embodiment, as shown in FIG. 1 and FIG. 3, the constitutive material of the shielding layer 30 and the constitutive material of the peripheral wiring 40 are the same, and the shielding layer 30 and the peripheral wiring 40 are provided in the same layer. Specifically, the constitutive material of the shielding layer 30 and the constitutive material of the peripheral wiring 40 may be, but not limited to, conductor materials and semiconductor materials. The conductive materials may include, but are not limited to, metal elements. Semiconductor materials may include, but are not limited to, silicon elements, oxides containing silicon elements. The metal element can be, but not limited to, molybdenum.

It can be understood that, in this embodiment, the shielding layer 30 and the peripheral wiring 40 are arranged in the same layer to prevent an additional thickness of the display panel 100 from being increased. Furthermore, the shielding layer 30 and the peripheral wiring 40 can be formed at the same time, or even integrally formed, so as to save the process. That is, the plurality of sub-resistance portions 4021, the lead portions 401, and a plurality of shielding portions can be formed by the same process, thereby simultaneously forming the peripheral wiring 40 and the shielding layer 30 at one time. The plurality of sub-resistance portions 4021 are connected to each other and in a curved shape. The lead portions 401 are connected to the plurality of sub-resistance portions 4021. The plurality of shielding portions are connected to each other and both ends of which are connected to the peripheral wiring 40.

In one embodiment, a length of the lead portion 401 is greater than the shortest distance between the first end and the second end. As discussed above, the peripheral wiring 40 includes the lead portions 401 and the resistance portions 402 connected to the lead portions 401 in series. Each resistance portion 402 is connected to at least one lead portion 401 in series in the corresponding connection direction. There is also a lead portion 401 that is not connected in series with the resistance portion 402. It can be understood here that the lead portions 401 are curved in the extending direction. That is, the lead portions 401 arranged in a curved manner in the extending direction may refer to the lead portions 401 which are connected in series with the resistance portions 402 or not connected in series with the resistance portions 402.

Specifically, as shown in FIG. 1 and FIG. 2, the lead portion 401 include a portion extending along the first direction D1 and a portion extending along the second direction D2. The lead portion 401 is curved in the extending direction. There is no restriction on the bending direction of each of the lead portions 401 here. For example, in the lead portion 401, the portion extending along the first direction D1 may be curved toward the second direction D2, but is not limited to. That is, it is a non-linear setting on the first direction D1. The portion extending along the second direction D2 may be curved toward the first direction D1, but is not limited to. That is, it is a non-linear setting on the second direction D2. It can be understood that, under a condition that sizes of the non-display area A2 in the first direction D1 and the second direction D2 are constant, in this embodiment, the lead portions 401 are arranged in a curved manner along any direction. An overall length of the lead portion 401 can be made longer to make the resistance value of the lead portion 401 larger, thereby increasing a path in the lead portion 401 that can accommodate static electricity. Also, the blocking ability of the lead portion 401 to static electricity is increased, thereby improving an overall antistatic performance of the peripheral wiring 40 to improve the yield or quality of the display panel 100.

In one embodiment, the shielding groups 301 are curved in the extending direction. Specifically, with reference to the above discussion, each shielding group 301 may be disposed opposite to the plurality of transistors 201 arranged along the first direction D1. The connected shielding portions in each shielding group 301 are in one-to-one correspondence with the plurality of transistors 201. Each shielding portion may be disposed opposite to the corresponding transistor 201. That is, the shielding groups 301 extend along the first direction D1.

Specifically, the shielding groups 301 are curved in the extending direction. There is no restriction on the bending direction of each of the shielding groups 301 here. For example, the shielding groups 301 can be curved to the second direction D2, but not limited to. That is, the shielding groups 301 are set non-linear in the first direction D1. It can be understood that under the condition that the size of the display area A1 in the first direction D1 is constant, in this embodiment, the shielding groups 301 are arranged in a curved manner along any direction. The total length of the shielding groups 301 can be made longer, so that the resistance value of the shielding groups 301 is larger, thereby increasing the paths in the shielding layer 30 that can accommodate static electricity. Alternatively, the antistatic ability of the shielding layer 30 is increased, thereby improving the overall antistatic ability of the shielding layer 30 and the peripheral wiring 40 to improve the yield or quality of the display panel 100.

Figure 4:
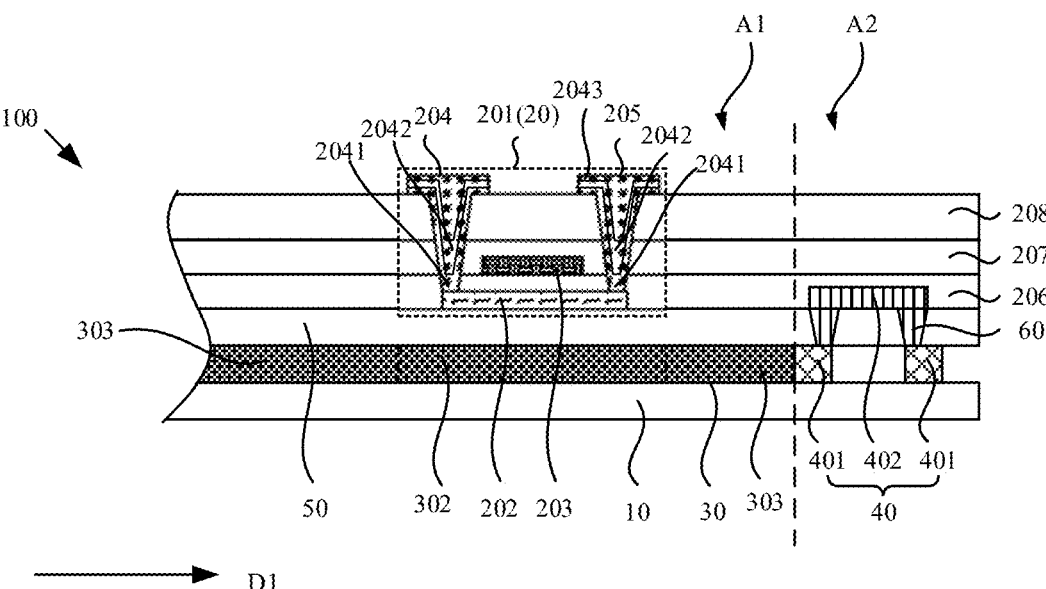
FIG. 4 is a schematic cross-sectional view of a partial structure of a second display panel of an embodiment of the present disclosure.
Figures 5, 6:
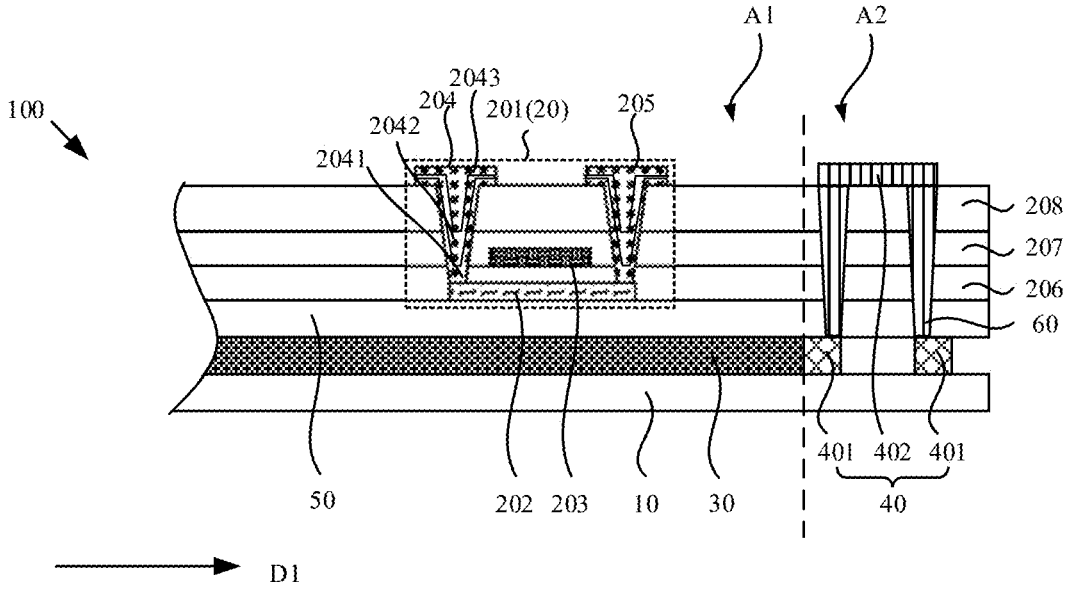
FIG. 5 is a schematic cross-sectional view of a partial structure of a third display panel of an embodiment of the present disclosure.
FIG. 6 is a schematic cross-sectional view of a partial structure of a fourth display panel of an embodiment of the present disclosure.

In one embodiment, as shown in FIG. 2, FIG. 4, and FIG. 5, the resistance portions 402 and the lead portions 401 are disposed in different layers, and the resistivity of the resistance portion 402 is greater than the resistivity of the lead portion 401. Specifically, a shape of the resistance portion 402 and a shape of the lead portion 401 are not limited here. The constituent material of the resistance portion 402 and the constituent material of the lead portion 401 are also not limited. The resistivity here can be understood as a resistance of a conductor with a length of 1 meter and a cross-sectional area of 1 square meter after straightening. It can be considered that the resistivity of the resistance portion 402 is greater than that of the lead portion 401 under the same external factors as temperature, pressure, and magnetic field.

It can be understood that when the shape and size of the resistance portion 402 are the same as the shape and size of the lead portion 401, in this embodiment, the resistivity of the resistance portion 402 is greater than that of the lead portion 401. The above-mentioned "in the connection direction (parallel to the first direction D1), in a unit size, the resistance value of the resistance portion 402 is greater than the resistance value of the corresponding lead portion 401 connected in series therewith" can be achieved. Of course, on the premise that the resistivity of the resistance portion 402 is greater than that of the lead portion 401, parameters of the resistance portion 402 and parameters of the lead portion 401 are appropriately set to achieve "in the connection direction (parallel to the first direction D1), in a unit size, the resistance value of the resistance portion 402 is greater than the resistance value of the corresponding lead portion 401 connected in series therewith". This embodiment is intended to emphasize that "the resistivity of the resistance portion 402 is greater than the resistivity of the lead portion 40" helps to achieve "in the connection direction (parallel to the first direction D1), in a unit size, the resistance value of the resistance portion 402 is greater than the resistance value of the corresponding lead portion 401 connected in series therewith".

In one embodiment, as shown in FIG. 1, FIG. 2, FIG. 4, and FIG. 5, the thin film transistor layer 20 includes a plurality of thin film transistors 201 disposed in the display area A1. The shielding layer 30 includes shielding blocks and shielding wires. The shielding blocks are arranged in a one-to-one correspondence with the plurality of transistors 201 and overlap with the plurality of transistors 201. The shielding wire is connected to two adjacent shielding blocks. The resistance portions 402 of the peripheral wiring 40 are electrically connected to the shielding wires and arranged in the same layer. Specifically, the shielding layer 30 may include a plurality of shielding groups 301 which extend along the first direction D1 and are arranged along the second direction D2. At least one end of each of the shielding groups 301 is electrically connected to one of the resistance portions 402. The resistance portions 402 and the thin film transistor layer 20 are disposed in the same layer. The shielding wires may be disposed on the same layer as at least one layer of the thin film transistor layer 20.

Here, the first direction D1 is parallel to a first side of the display panel 100, the second direction D2 is parallel to a second side of the display panel 100, and the first direction D1 is perpendicular to the second direction D2 as an example for description. Specifically, as shown in FIG. 4 and FIG. 5, the plurality of transistors 201 in the thin film transistor layer 20 may be arranged in an array along the first direction D1 and the second direction D2. In conjunction with the above discussion, each shielding group 301 may be disposed opposite to a plurality of transistors 201 arranged along the first direction D1. Furthermore, each shielding group 301 may include a plurality of shielding portions that are electrically connected. Each shielding portion may be disposed opposite to the corresponding transistor 201. Specifically, each shielding group 301 may be disposed opposite to a plurality of transistors 201 arranged in the same row. Furthermore, each shielding block may be disposed opposite to a corresponding transistor 201 in a corresponding row of transistors 201. A width of the shielding wire can be less than or equal to a width of shielding block. It can be understood that for multiple shielding blocks close to the non-display area A2, they can be connected to the peripheral wiring 40 through a corresponding shielding wire.

Specifically, in a unit size, since the resistance value of the resistance portion 402 in the connection direction is larger, the resistance value of the resistance portion 402 is greater than that of the lead portion 401 under the same size in the connection direction. It can be understood that, in this embodiment, at least one end of each shielding group 301 is electrically connected to one resistance portion 402. The resistance values of the plurality of shielding groups 301 in the extending direction can be increased. By dispersing the arrangement of the resistance portions 402, the resistance value of one of the shielding groups 301 in the extending direction is prevented from accumulating more static electricity and discharging. The antistatic capability of the peripheral wiring 40 is improved, thereby improving the yield or quality of the display panel 100.

Furthermore, the constituent material of the resistance portions 402, the constituent material of the shielding wires, and the constituent material of the thin film transistor layer 20 that is arranged on the same layer as the shielding wires are the same. This embodiment does not limit film layers of the resistance portion 402 and the thin film transistor layer 20 that are arranged in the same layer and have the same constituent material, as long as the resistivity of the resistance portion 402 is greater than that of the lead portion 401. It can be understood that, in this embodiment, the resistance portions 402 and the thin film transistor layer 20 are disposed in the same layer to prevent an additional thickness of the display panel 100 from being increased. Furthermore, the resistance portions 402 and the thin film transistor layer 20 can be formed at the same time to save process. That is, the resistance portions 402 in the non-display area A2 and corresponding film layers of the thin film transistor layer 20 in the display area A1 can be formed by the same process, so as to simultaneously form the resistance portions 402 and the corresponding film layers of the thin film transistor layer 20 at one time.

Specifically, in conjunction with the above discussion, "the resistivity of the resistance portion 402 is greater than the resistivity of the lead portion 401". That is, this embodiment can realize that the constituent material of the resistance portion 402 is different from that of the lead portion 401 by "the constituent material of the resistance portion 402 and the constituent material of the thin film transistor layer 20 are the same". Furthermore, a constituent material of one of elements in the thin film transistor layer 20 is selected to form the resistance portion 402, so that the resistivity of the resistance portion 402 is higher.

In one embodiment, as shown in FIG. 4 and FIG. 5, the thin film transistor layer 20 includes: a gate layer 203, an active layer 202, a first insulating layer 206, and a source-drain layer. The active layer 202 is disposed on a side of the gate layer 203 close to or away from the substrate 10. The first insulating layer 206 is disposed between the gate layer 203 and the active layer 202. The source-drain layer is disposed on a side of the active layer 202 away from the substrate 10, is electrically connected to the active layer 202, and is insulated from the gate layer 203. As shown in FIG. 4, the resistance portions 402 (i.e., the first resistance portions) and the active layer 202 are arranged in the same layer. Alternatively, as shown in FIG. 5, the resistance portions 402 (i.e., the second resistance portions) and the source-drain layer are arranged at the same layer. Further, as shown in FIG. 4, the first resistance portion is disposed in the same layer as the active layer 202 and a first metal layer 2041.

Specifically, in this embodiment, the thin film transistor layer 20 is not limited to a plurality of transistors with a top gate structure or a bottom gate structure. Here, the transistor with the top gate structure is used as an example for description, that is, the gate layer 203 is disposed on a side of the active layer 202 away from the substrate 10. Specifically, in conjunction with the above discussion, each thin film transistors 201 in the thin film transistor layer 20 may include the active layer 202, the gate layer 203, and the source-drain layer. The gate layer 203 is disposed on the side of the active layer 202 away from the substrate 10. The source-drain layer is disposed on the side of the gate layer 203 away from substrate 10. The source-drain layer includes a source portion 204 and a drain portion 205. The source portion 204 is disposed opposite to and electrically connected to one end of the active layer 202. The drain portion 205 is disposed opposite to and electrically connected to another one end of the active layer 202. Furthermore, the display panel 100 further includes the first insulating layer 206, the second insulating layer 207, and the interlayer dielectric layer 208. The first insulating layer 206 is disposed between the active layer 202 and the gate layer 203 and covers the active layer 202. The second insulating layer 207 covers a side of the gate layer 203 away from the substrate 10. The interlayer dielectric layer 208 covers a side of the second insulating layer 207 away from the substrate 10. That is, the thin film transistor layer 20 includes the active layer 202, the first insulating layer 206, the gate layer 203, the second insulating layer 207, and the source-drain layer. The active layer 202 is disposed on the side of the shielding layer 30 away from the substrate 10. The first insulating layer 206 is disposed on the side of the active layer 202 away from the substrate 10. The gate layer 203 is disposed on the side of the first insulating layer 206 away from the substrate 10. The second insulating layer 207 is disposed on the side of the gate layer 203 away from the substrate 10. The source-drain layer is disposed on the side of the second insulating layer 207 away from the substrate 10. The resistance portion 402 includes a first resistance portions or a second resistance portions. The first resistance portion is arranged on the same layer as the active layer 202. The second resistance portion is arranged on the same layer as the source-drain layer.

A constituent material of the active layer 202 may include at least one of amorphous silicon and polysilicon. The polysilicon may include low temperature polysilicon. Furthermore, the constituent material of the active layer 202 may also include oxide. Specifically, for example, the active layer 202 is formed by using a low temperature polysilicon technology, which can have higher electron mobility. In this way, when the thin film transistor 201 charges a corresponding pixel, a larger driving current can be generated to improve a charging speed. For example, the active layer 202 made of amorphous silicon or oxide can have a low leakage current to prevent the leakage of the thin film transistor 201 from interfering a signal under exposure conditions. Specifically, for example, when the constituent material of the active layer 202 includes amorphous silicon, two ends of the active layer 202 that are electrically connected to the source-drain layer can be doped with elements to form two impurity regions. The dopant elements may include phosphorus ions. A concentration of the doping elements in the doping region can be set according to an actual situation. For example, when the constituent material of the active layer 202 includes oxide, it can be avoided to dispose dopant elements to form the dopant region.

Furthermore, based on the above discussion, as shown in FIG. 4, the resistivity of the first resistance portion and the resistivity of the active layer 202 are the same, and the resistivity of the second resistance portion and the resistivity of the source-drain layer are the same. Specifically, for the first resistance portion arranged in the same layer as the active layer 202, the first resistance portion and the active layer 202 can be formed simultaneously using the same material. According to the above discussion, the constituent material of the active layer 202 is a semiconductor material. That is, the constituent material of the first resistance portion is the semiconductor material. For the semiconductor material, reference may be made to the above description about the constituent material of the active layer 202. The constituent material of the lead portions 401 is generally a conductor material. That is, the resistivity of the first resistance portion may be larger. Specifically, a buffer layer 50 may be disposed between the shielding layer 30 and the thin film transistor layer 20. After the buffer layer 50 is formed, the active layer 202 including the resistance portions 402 in the non-display area A2 and the active layer 202 in the display area A1 may be formed by the same process to simultaneously form the resistance portions 402 and the active layer 202 at one time.

In an embodiment, as shown in FIG. 5, the source-drain layer includes the first metal layer 2041 and a second metal layer 2042. A constituent material of the first metal layer 2041 includes titanium. The second metal layer 2042 is disposed on a side of the first metal layer 2041 away from the substrate 10. A constituent material of the second metal layer 2042 is different from the constituent material of the first metal layer 2041. Furthermore, the resistance portions 402 (i.e., the second resistance portions) and the source-drain layer are arranged in the same layer. The constituent material of the second metal layer may include aluminum. Furthermore, the source-drain layer may further include the third metal layer 2043 disposed on a side of the second metal layer 2042 away from the substrate 10. A constituent material of the third metal layer 2043 may be the same as the constituent material of the first metal layer 2041.

Specifically, a first via hole may be formed on the first insulating layer 206, the second insulating layer 207, and the interlayer dielectric layer 208. The source-drain layer may extend from a side of the interlayer dielectric layer 208 away from the substrate 10 through the first via hole to contact the active layer 202. In combination with the above discussion, the first metal layer may extend from the side of the interlayer dielectric layer 208 away from the substrate 10 through the first via hole to contact the active layer 202. The second metal layer and the third metal layer may be sequentially formed on the first metal layer.

It can be understood that, as shown in FIG. 5, in this embodiment, on the one hand, the first metal layer and the resistance portions 402 made of titanium can have higher resistivity than the shielding layer 30 and the lead portions 401 made of titanium, which is helpful to realize "in the connection direction, in a unit size, the resistance value of the resistance portion 402 is greater than the resistance value of the lead portion 401 connected in series therewith". On the other hand, the first metal layer and the resistance portions 402 can be formed at the same time to save process and prevent an additional thickness of the display panel 100 from being increased. After forming the interlayer dielectric layer 208, the resistance portions 402 in the non-display area A2, the plurality of source portions 204 in the display area A1, and the plurality of drain portions 205 may be formed through the same process to simultaneously form the resistance portions 402 and the source-drain layer at one time.

In an embodiment, as shown in FIG. 4 and FIG. 5, the display panel 100 further includes: a second via hole and a conductor portion 60. The second via hole communicates between the resistance portion 402 and the lead portion 401. The conductor portion 60 is filled in the second via hole. The conductor portion 60 electrically connects the resistance portion 402 and the lead portion 401. It should be noted that, in conjunction with the discussion above, when the resistance portion 402 and thin film transistor layer 20 are disposed in the same layer, since the lead portion 401 are generally disposed in the same layer as the shielding layer 30, the resistance portion 402 and the lead portion 401 connected in series therewith are disposed in different layers.

It can be understood that, for example, as shown in FIG. 4, when the resistance portion 402 and the active layer 202 are disposed in the same layer, the second via hole can penetrate through the buffer layer 50 to connect the resistance portion 402 and the lead portion 401. The conductor portion 60 filled in the second via hole can be electrically connected to the resistance portion 402 disposed on an upper side of the buffer layer 50 and the lead portion 401 disposed on a lower side of the buffer layer 50. For another example, as shown in FIG. 5, when the resistance portion 402 and the source portion 204 and the drain portion 205 are disposed in the same layer, the second via hole may penetrate through the buffer layer 50, the first insulating layer 206, the second insulating layer 207, and the interlayer dielectric layer 208 to connect the resistance portion 402 and the lead portion

401. The conductor portion 60 filled in the second via hole can be electrically connected to the resistance portion 402 disposed on an upper side of the interlayer dielectric layer 208 and the lead portion 401 disposed on a lower side of the buffer layer 50.

In one embodiment, as shown in FIG. 6, the resistance portion 402 and the lead portion 401 are arranged in different layers. A projection of the resistance portion 402 on a plane perpendicular to the substrate 10 extends beyond a layer where the shielding layer 30 is located. The resistance portion 402 includes two curved portions disposed on both sides or a same side of the lead portion 401 corresponding to the shortest distance between the first end and the second end. Specifically, as shown in FIG. 6, an example is illustrated here where the resistance portion 402 includes two sub-resistance portions 4021 disposed above the lead portion 401 corresponding to the shortest distance between the first end and the second end. In conjunction with the discussion above, the connection between the plurality of resistance portions 402 and the lead portions 401 may be achieved through the conductor portions 60.

Specifically, referring to FIG. 1, the resistance portion 402 in the peripheral wiring 40 is arranged in a curved manner on a plane parallel to the substrate 10 to extend, which can make a total length of the resistance portion 402 longer. Similarly, the resistance portion 402 in this embodiment is bent and arranged to extend on a plane perpendicular to the substrate 10, which can also make the total length of the resistance portion 402 longer. When the constituent material is the same everywhere in the peripheral wiring 40, the resistance value of the resistance portion 402 is larger, so as to realize the above-mentioned "in the connection direction (parallel to the first direction D1), in a unit size, the resistance value of the resistance portion 402 is greater than the resistance value of the corresponding lead portion 401 connected in series therewith". Specifically, in this embodiment, a portion of the projection of the resistance portion 402 on the plane perpendicular to the substrate 10 extending beyond the layer where the shielding layer 30 is located overlaps with which film layer in the display panel 100 is not limited, as long as there is a portion of the "extending beyond . . . portion" can be located above the shielding layer30, and a portion of the "extending beyond . . . portion" can be located below the shielding layer30.

An embodiment of the present disclosure provides a mobile terminal, the mobile terminal includes a terminal main body part and the touch panel as described in any one of the above, the terminal main body part and the touch panel are combined into one body.

The display panel provided by the embodiments of the present disclosure includes the display area and the non-display area surrounding the display area. The display panel includes the substrate, the thin film transistor layer, the shielding layer, and the peripheral wiring. The thin film transistor layer is disposed on the substrate and in the display area. The shielding layer is disposed between the substrate and the thin film transistor layer, and disposed in the display area. The peripheral wiring is disposed in the non-display area and electrically connected to the shielding layer. The peripheral wiring includes the lead portions and the resistance portions, each of the resistance portions includes the first end and the second end, the first end is connected to the shielding layer, the second end is connected to one of the lead portions, and the resistance of one of the resistance portions is greater than the resistance of one of the lead portions corresponding to the shortest distance between the first end and the second end. The present disclosure increases a resistance value per unit length of an extension path of the peripheral wiring by setting the resistance value of the resistance portion to be larger in a unit size. Thus, a total resistance value of the peripheral wiring is increased, so as to improve an antistatic capability of the peripheral wiring, and a yield or quality of the display panel is improved.

The display panel and the mobile terminal provided by the embodiments of the present disclosure are described above in detail. The principles and implementations of the present disclosure are explained with specific examples in this specification. The descriptions of the above embodiments are only used to help understand the technical solutions and core ideas of the present disclosure. Those of ordinary skill in the art should understand that they can still make modifications to the technical solutions described in the foregoing embodiments, or perform equivalent replacements to some of the technical features. These modifications or replacements do not make the essence of the corresponding technical solutions deviate from the scope of the technical solutions of the various embodiments of the present disclosure.

What is claimed is:

1. A display panel, comprising a display area and a non-display area surrounding the display area, wherein the display panel comprises:

a substrate;

a thin film transistor layer disposed on the substrate and in the display area;

a shielding layer disposed between the substrate and the thin film transistor layer, and disposed in the display area; and a peripheral wiring disposed in the non-display area and electrically connected to the shielding layer;

wherein the peripheral wiring comprises lead portions and resistance portions, each of the resistance portions comprises a first end and a second end, the first end is connected to the shielding layer, the second end is connected to one of the lead portions, wherein in a vertical direction extending from the substrate to the thin film transistor layer, the lead portions are at a same height as the shielding layer, and the resistance portions are located above the lead portions on a buffer layer;

wherein the resistance portions are disposed on two sides or a same side of an imaginary connection line of the shortest distance between the first end and the second end, and a connection line is between portions of each of the resistance portions which are located the two sides of the imaginary connection line; or the resistance portions are disposed on a same side of the imaginary connection line, and a portion of the resistance portion which is between the first end and the second end is curved:

wherein a resistivity of one of the resistance portions is greater than a resistivity of one of the lead portions.

2. The display panel according to claim 1, wherein at least one side of one of the resistance portions at the imaginary connection line of the shortest distance between the first end and the second end is curved.

3. The display panel according to claim 1, wherein the resistance portions and the lead portions are arranged on a same layer.

4. The display panel according to claim 1, wherein the thin film transistor layer comprises a plurality of thin film transistors disposed in the display area, the shielding layer comprises shielding blocks and shielding wires, the shielding blocks are in one-to-one correspondence with the plurality of transistors and overlap with the plurality of transistors, and each of the shielding wires is connected to two adjacent shielding blocks;

wherein the resistance portions of the peripheral wiring are electrically connected to the shielding wires and arranged in a same layer.

5. The display panel according to claim 4, wherein the shielding layer comprises a plurality of shielding groups extending along a first direction and arranged along a second direction, one end of one of the shielding groups is electrically connected to one of the resistance portions, another end of the one of the shielding groups is electrically connected to another one of the resistance portions.

6. The display panel according to claim 1, wherein the thin film transistor layer comprises:

an active layer disposed on a side of the shielding layer away from the substrate;

a first insulating layer disposed on a side of the active layer away from the substrate;

a gate layer disposed on a side of the first insulating layer away from the substrate;

a second insulating layer disposed on a side of the gate layer away from the substrate; and a source-drain layer disposed on a side of the second insulating layer away from the substrate;

wherein each of the resistance portions comprises a first resistance portion or a second resistance portion, the first resistance portion is disposed on a same layer as the active layer, and the second resistance portion is disposed on a same layer as the source-drain layer.

7. A display panel, comprising a display area and a non-display area surrounding the display area, wherein the display panel comprises:

a substrate;

a thin film transistor layer disposed on the substrate and in the display area;

a shielding layer disposed between the substrate and the thin film transistor layer, and disposed in the display area; and a peripheral wiring disposed in the non-display area and electrically connected to the shielding layer;

wherein the peripheral wiring comprises lead portions and resistance portions, each of the resistance portions comprises a first end and a second end, the first end is connected to the shielding layer, the second end is connected to one of the lead portions, wherein in a vertical direction extending from the substrate to the thin film transistor layer, the lead portions are at a same height as the shielding layer, and the resistance portions are located above the lead portions on a buffer layer;

wherein the resistance portions are disposed on two sides of an imaginary connection line of the shortest distance between the first end and the second end, and a connection line is between portions of each of the resistance portions which are located the two sides of the imaginary connection line; or the resistance portions are disposed on a same side of the imaginary connection line, and a portion of the resistance portion which is between the first end and the second end is curved.

8. The display panel according to claim 7, wherein at least one side of one of the resistance portions at the imaginary connection line of the shortest distance between the first end and the second end is curved.

9. The display panel according to claim 7, wherein the resistance portions and the lead portions are arranged on a same layer.

10. The display panel according to claim 7, wherein the thin film transistor layer comprises a plurality of thin film transistors disposed in the display area, the shielding layer comprises shielding blocks and shielding wires, the shielding blocks are in one-to-one correspondence with the plurality of transistors and overlap with the plurality of transistors, and each of the shielding wires is connected to two adjacent shielding blocks;

wherein the resistance portions of the peripheral wiring are electrically connected to the shielding wires and arranged in a same layer.

11. The display panel according to claim 10, wherein the shielding layer comprises a plurality of shielding groups extending along a first direction and arranged along a second direction, one end of one of the shielding groups is electrically connected to one of the resistance portions, another end of the one of the shielding groups is electrically connected to another one of the resistance portions.

12. The display panel according to claim 7, wherein a resistivity of one of the resistance portions is greater than a resistivity of one of the lead portions.

13. The display panel according to claim 12, wherein the thin film transistor layer comprises:

an active layer disposed on a side of the shielding layer away from the substrate;

a first insulating layer disposed on a side of the active layer away from the substrate;

a gate layer disposed on a side of the first insulating layer away from the substrate;

a second insulating layer disposed on a side of the gate layer away from the substrate; and a source-drain layer disposed on a side of the second insulating layer away from the substrate;

wherein each of the resistance portions comprises a first resistance portion or a second resistance portion, the first resistance portion is disposed on a same layer as the active layer, and the second resistance portion is disposed on a same layer as the source-drain layer.

14. The display panel according to claim 13, wherein a resistivity of the first resistance portion is the same as a resistivity of the active layer, and a resistivity of the second resistance portion is the same as a resistivity of the source-drain layer.

15. The display panel according to claim 14, wherein the source-drain layer comprises:

a first metal layer, wherein a constituent material of the first metal layer comprises titanium, and the first resistance portion and the first metal layer are arranged in the same layer; and a second metal layer disposed on a side of the first metal layer away from the substrate, wherein a constituent material of the second metal layer is different from the constituent material of the first metal layer.

16. The display panel according to claim 12, further comprising:

a via hole connected between one of the resistance portions and one of the lead portions; and a conductor portion filled in the via hole, wherein the conductor portion electrically connects the one of the resistance portions and the one of the lead portions.

17. The display panel according to claim 7, wherein a constituent material of the shielding layer is the same as a constituent material of the peripheral wiring, and the shielding layer and the peripheral wiring are arranged in a same layer.

18. The display panel according to claim 7, wherein the resistance portions and the lead portions are arranged in different layers, a projection of one of the resistance portions on a plane perpendicular to the substrate extends beyond a layer where the shielding layer is located, and one of the resistance portions comprises two curved sub-resistance portions disposed on both sides or a same side of one of the lead portions corresponding to the shortest distance between the first end and the second end.

19. The display panel according to claim 7, wherein a length of one of the lead portions is greater than the shortest distance between the first end and the second end.

* * * * *